United States Patent [19]

Kojima et al.

[11] 4,292,389
[45] Sep. 29, 1981

[54] PROCESS FOR PREPARING PHOTOSENSITIVE PLATES FOR PRINTING

[75] Inventors: Hiroshi Kojima; Kunio Ito; Masami Akiyama; Takeshi Tanaka, all of Hino, Japan

[73] Assignee: Konishiroku Photo Industry Co., Ltd., Tokyo, Japan

[21] Appl. No.: 115,124

[22] Filed: Jan. 24, 1980

[30] Foreign Application Priority Data

Jan. 31, 1979 [JP] Japan ..................... 54-9186
Mar. 9, 1979 [JP] Japan ..................... 54-28044
Mar. 9, 1979 [JP] Japan ..................... 54-28045

[51] Int. Cl.$^3$ ............................... G03C 1/76
[52] U.S. Cl. ..................... 430/169; 430/273; 430/141; 430/162; 430/155; 430/327; 430/349; 430/330; 430/396; 430/950; 430/961; 430/523; 430/300; 430/302; 430/307; 430/935; 427/180; 427/189; 427/194; 427/202
[58] Field of Search ............... 430/141, 162, 155, 327, 430/349, 330, 273, 396, 950, 961, 523, 300, 302, 307, 168, 169, 935; 427/180, 189, 194, 202; 118/60, 66, 67

[56] References Cited

U.S. PATENT DOCUMENTS 3,687,703  8/1972  Ohashi et al. .................... 430/950
4,168,979  9/1979  Okishi et al. .................... 430/273

*Primary Examiner*—Won H. Louie, Jr.
*Attorney, Agent, or Firm*—Frishauf, Holtz, Goodman & Woodward

[57] ABSTRACT

There is provided a process for preparing a photosensitive plate for printing which comprises providing a heat-depositable fine powder having a constant directional size of 0.5–40μ onto the surface of a photosensitive plate for printing at a ratio of 0.005–0.5 g. of the said powder per m$^2$ of the said plate to uniformly disperse and adhere the said powder onto the said surface, while preheating the right side (side on which powder adheres) and/or the reverse side of the said plate upon providing said powder or before or after providing, and subsequently contacting the right side of the said plate with a heating roll having a high releasing surface, whereby the said fine powder is fused and fixed on onto the surface of the said plate.

15 Claims, 3 Drawing Figures

PROCESS FOR PREPARING PHOTOSENSITIVE PLATES FOR PRINTING

This invention relates to the preparation of a photosensitive plate for printing.

Heretofore, there has been employed a technique (named a vacuum contacting method) wherein an original film is contact-printed on a photosensitive plate for printing (which will be referred hereinafter as a photosensitive plate) by placing the film and the photosensitive plate laid between the glass plate and a rubber sheet of a vaccum printing frame and then evacuating the space between the glass plate and the rubber sheet to contact the film and the photosensitive plate closely. Also, there have been proposed various methods wherein a satisfactory contacting can be accomplished in a relatively short time over the whole surfaces to be contacted. More specifically, Japanese Patent Provisional Publication No. 125805/1975, for instance, discloses a photosensitive plate for printing having a matt layer coated over the surface thereof, which may improve in a vacuum contacting property. However, the matt layer coated over the photosensitive surface tends to prevent a developer from penetration and decreases the developing property. A residual portion of the matt layer in image area after development tends to inhibit the affinity for ink and further the matt layer frequently tends to be dissolved in the developer so that the developer is exhausted. Japanese Patent Provisional Publication No. 11110/1976 discloses a photosensitive plate having a finely-patterned coated layer, which may improve in adverse effect upon a developing property (delay in development), as compared with the above-mentioned matt layer method. However, the finely-patterned coated layer when developed with an exhausted developer tends to be incompletely removed thereby even the non image portion is printed out (this phenomena is called tinting), a large amount of a binder or a matt agent is required for satisfactory vacuum contacting property, a developer tends to be exhausted and, moreover, equipment and steps for the coated layer are complicated so as to increase the coating cost and a coated layer with fine patterns sometimes may not be coated depending upon the composition, thickness and surface properties of a photosensitive layer. Also, Japanese Patent Provisional Publication No. 98505/1976 discloses a method for coating a wax- or fine powder resin having a mold releasing property in order to avoid contaminating of an original film with a coated layer for improving the vacuum contacting property. However, such a coated layer is liable to fall of the surface of a photosensitive plate for printing without tight adherence thereto and, if uniformly coated over the whole surface for tight adherence, there are found disadvantages of not only inhibiting penetration of a developer, but also of increased coating due to complicated equipment and steps for coating the wax- or fine powder resin and troublesome maintenance and control in its preparation.

On the other hand, "Japan Printer", Vol. 53(10), 23 (1970) by Inoue and Iino and "Printing Information", Vol. 33(11), 90 (1973) by Ishiyama et al. disclose a method wherein a solid powder, e.g., talc is spread and adhered onto the surface of a photosensitive layer of a photosensitive plate for printing by mechanical means prior to contact-printing step (named "powdering"). Such powdering may improve the vacuum contacting property by the simple procedure of merely spreading an anti-offset powder for printed matters or commercially available talc powder with a spray gun or puff and also solve the problems of a developing property, tinting, preparation as seen in the above-recited prior art. However, the powdering may simultaneously show the following drawbacks: Namely, the powdering is generally and frequently applied when the photosensitive plate and hence working environment is polluted with spread solid powder in a processing room and various inconveniences are produced in a processing step, which are not favourable from the standpoint of environmental hygiene, and it is also not to be disregarded that cleaning of machinery should be efficiently effected for the powdering step. Further, the solid powder over the powdered photosensitive plate for printing tends to fall off during handling, which leads to environmental pollution and no production of expected vacuum contacting property.

Under such circumstances, we have made earnest studies on a heat-deposit method for fixing the dispersed solid powder on the surface of a photosensitive plate for printing with the intention of avoiding the above-mentioned disadvantages in the prior art.

As a result, in the case where thermal radiation from, e.g., hot air, infrared heater and so on is utilized for heat-deposit of a solid powder on the surface of a photosensitive plate, it has been found that heat required for heat-deposit may bring the whole photosensitive plate for printing to an elevated temperature to make an adverse effect upon a photosensitive layer; a large scale equipment for heating step may be needed in view of a manufacture plant, which results in increased production cost and complicated maintenance and control in manufacture; in particular, in the case of hot air, the solid powder dispersed and adhered onto the surface of the said plate is scattered with hot air to produce no expected vacuum contacting property or, if more solid powder is previously adhered to a photosensitive plate for printing as the said scattering expected, more solid powder unexpectedly may be heat-deposited onto the said plate surface to produce an adverse affect on printing characteristics. On the other hand, in the case where heat transfer by heating rolls is utilized for heat-deposit of a solid powder onto the said plate surface, it is sufficient to merely fuse the said solid powder without any need to bring the said plate as a whole to an elevated temperature, thereby leading to inexpensive equipment for heating step. However, it has been found that the heating roll for heat transfer to the said solid powder has to be in contact with the said powder so that a portion of the fused solid powder is deposited on the heating roll and no uniform amount of the powder is deposited onto the said plate surface; as a result, parts of the said plate lacking in expected vacuum contacting property are indiscriminately present with other parts of the said plate having vacuum contacting property but adversely affecting printing characteristics due to unexpected heat-deposit of the solid powder, which leads to an extreme difficulty in maintenance and control of heating step. Moreover, even if heating roll is applied to remove the aforesaid drawbacks, there have been found several problems as follows: Aluminum plate commonly employed as a support for a photosensitive plate for printing tends to develop an uneven thickness in the wide direction during its elongation step of the manufacture process and become thin stretched in its middle part directed to width. These facts may in some cases cause incomplete deposit in the middle part toward width to give no vacuum contacting property as expected, when a heat-depositable fine powder is to be heat-deposited on the surface of the plate comprising such a support. In addition, if the temperature of heating roll is raised in order to eliminate this drawback, it has been found that the photosensitive layer on both sides directed to width in the resultant plate may be adversely affected and the resultant plate may become crumpled.

This invention has been completed upon the above-explained findings.

The primary object of this invention is to provide a process for preparing a photosensitive plate with an improved vacuum contacting property, which has a solid powder tightly heat-fused onto its surface without any falling of the said powder during handling as seen in the prior powdering art.

Another object is to provide a process for preparing a photosensitive plate which has a superior vacuum contacting property upon print-contacting and further has not an adverse effect on its printing properties.

The other object is to provide a process for preparing a photosensitive plate, wherein the whole plate is not brought to such an elevated temperature that a heat-depositable fine powder is fused to deposit on a surface by a hot air, heat radiation with an infrared heater or the like during the heating step for heat-deposit of a solid powder and thus a photosensitive layer is not adversely affected.

The other object is to provide a process for preparing a photosensitive plate wherein a solid powder can be heat-deposited uniformly onto the surface of a photosensitive plate during heating step and a printing plate can be prepared with a uniform quality.

The other object is to provide a process for preparing a photosensitive plate wherein a solid powder can be uniformly heat-deposited even when thickness of a support plate of a photosensitive plate is uneven.

The other object is to provide a process for preparing a photosensitive plate having a heat-deposited powder whereby the photosensitive layer of the photosensitive plate is not adversely effected.

The other object is to provide a process for preparing a photosensitive plate wherein the temperature adapted to have a fine powder heat-deposited onto the surface of a plate is easily controllable.

The other object is to provide a process for preparing a photosensitive plate whereby crumpled photosensitive plate can be prevented owing to heating step and the resultant uneven heat-deposit of solid powders can be also prevented.

The other object is to provide a process for preparing a photosensitive plate with an inexpensive production cost and a simple and inexpensive heating equipment even from the standpoint of a manufacturing plant.

The other object is to provide a process for preparing a photosensitive plate wherein a large number of photosensitive plates with a uniform quality can be continuously produced with easy maintenance and control of heating step in a process.

These objects and other objects as stated hereinbelow can be accomplished according to the present process which comprises providing a heat-depositable fine powder having a constant directional size of 0.5–40μ, so as to be dispersed on the surface of right side of a photosensitive plate and adhere the said powder onto the said surface, while preheating the right side and/or the reverse side of the said plate upon providing or before or after providing, and subsequently contacting the right side of the said plate with a heating roll having a high releasing surface, whereby the said fine powder is heat-deposited onto the surface of the said plate.

The photosensitive plate, the surface of which is deposited with a heat-depositable fine powder according to this invention, has essentially a photosensitive layer provided over a support and may include well-known photosensitive plates for printing commonly employed to prepare printing plates such as lithographic printing plates, typographic printing plates, intaglio printing plates and the like. A photosensitive layer side and a support side of the two sides of surfaces are referred as a right side and a reverse side respectively hereinafter.

Even further, it is to be noted that the said preheating procedures may be effected by contacting the reverse side of the photosensitive plate with a heating roll or by subjecting the right and/or reverse side of the plate to a non-contacting heating means, illustratively infrared rays or far infrared rays, all of which fall within the scope of this invention. Also, it is contemplated within this invention that a thermal detector is placed before and after a heating roll so as to maintain constant a temperature of the photosensitive plate immediately before contact with a heating roll, thereby heating ability of said preheating means is controlled via a controller in the above-mentioned process of this invention.

The process of this invention is illustrated in the attached drawings and some preferred embodiments of this invention with which the present process can be practiced by referring to the drawings.

In the drawings wherein like reference numerals designate like parts throughout the following views.

Figure 1:
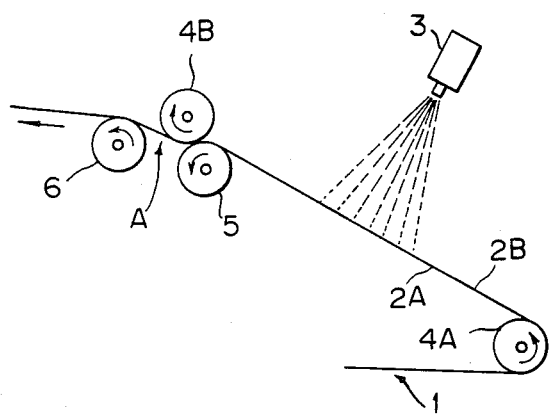
FIG. 1 is a schematic diagram outlining the practice of the present process for preparing a photosensitive plate in one representative embodiment thereof.

Referring now to FIG. 1, there is illustrated one representative embodiment of the present process. A photosensitive plate 1, which is continuously run at a constant speed, is preheated by contacting the reverse side 2A of said plate with a preheating roll 4A heated to a suitable temperature and then a heat-depositable fine powder is supplied at a given amount by a dust supplier 3 onto the right side 2B of said plate 1 to uniformly disperse and adhere thereto. Thereafter, said plate 1 is passed through between a heating roll 4B having a good releasing surface and a press contacting roll 5 having good insulating and elastic properties, whereupon the right side 2B of said plate 1 is press-contacted with the aforesaid heating roll 4B. Thus, the heat-depositable fine powder uniformly dispersed and adhered to the right side 2B of said plate 1 is fused and deposited onto the right side 2B.

In this drawing, the numeral 6 indicates a roll optically placed, which is set to further contact the right side of said plate 1, after passing between the heating roll 4B having a high releasing property and the insulating, press-contacting roll 5, with the heating roll 4B (at the place indicated with a symbol A) in order to enlarge the contact area of said plate right side to the heating roll 4B.

In this embodiment, it is specifically referred to above that the preheating roll 4A is placed before the step for uniform dispersion and adherence of said powder onto the right side 2B of said plate, but the position to place said preheating roll 4A is not limited to the foregoing and such a roll may be placed at any optional position, namely, after the supplying step of said powder or simultaneously therewith, provided that it is set before contact of said plate with said heating roll. Besides, said preheating roll 4A is not always single as shown in FIG. 1, but it may be placed in plural numbers if required. In this case of plural rolls, a position to place each preheating roll 4A is not critical.

The preheating roll 4A which may be employed in the present embodiment is to aid heat-deposit of a heat-depositable fine powder onto the right side 2B of said photosensitive plate by the heating roll 4B having a high releasing surface, while preventing a photosensitive plate from unfavourable results from heat expansion of said plate due to a rapid heating of the right side 2B of said plate with the heating roll 4B. Therefore, it is desirable to set a lower heating temperature applied to said plate by the preheating roll 4A at than that applied by the heating roll 4B. Thus, it is desirable for the above-recited present objects that an upper and a lower limit of the heating temperature by the preheating roll 4A should be defined such that the surface temperature of the plate immediately before the contacting position of said plate with the heating roll 4B be of the level mentioned as follows: Namely, the upper limit is to be up to a temperature obtained by adding 50° C. to the second transition point (as measured by a differential scanning calorimeter in centrigrade unit, and so forth hereinafter) of the heat-depositable fine powder to be used, more preferably a temperature obtained by adding 20° C. to the second transition point of the fine grain. The lower limit is to be up to a temperature obtained by subtracting 30° C. from the second transition point of the fine powder employed, more preferably by subtracting 10° C. Then, a heating temperature by the heating roll 4A may be desirably selected between the above-defined upper and lower limits, depending upon the type of a photosensitive plate to be formulated, influences upon a photosensitive layer, the sort and amount of the fine powder to be applied and the like.

Figure 2:
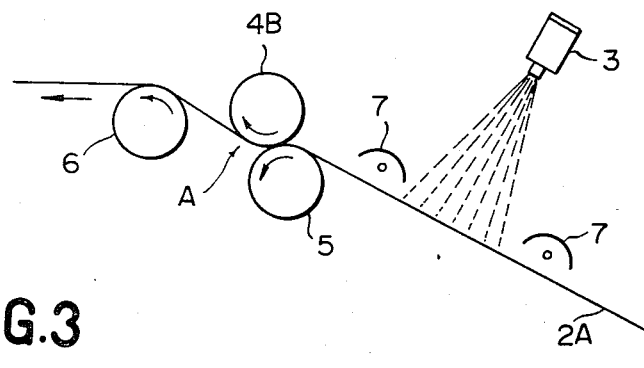
FIG. 2 is a schematic diagram outlining the practice of the present process in another representative embodiment thereof.

Referring to FIG. 2, there is illustrated another representative embodiment of the present process. A non-contacting heating measures, e.g., a far infrared heater 7 is used for preheating instead of the heat roller 4A in the embodiment mentioned before.

In this embodiment, two of the far infrared heaters 7 are used, one placed before and one after the step for uniform dispersion and adherence of said powder onto the right side 2B of said plate, but the position to place said far infrared heater 7 is not limited to the foregoing and such a heater may be placed at any optional position, namely, after the supplying step of said powder or simultaneously therewith, provided that it is set before contact of said plate with said heating roll. Besides, said far infrared heater 7 is not always in a set of two as shown in FIG. 2, but it may be placed in single or plural numbers if required. In case of plural heaters, the position to place each far infrared heater 7 is not critical.

The far infrared heater 7 which may be employed in the present embodiment is to aid heat-deposit of a heat-depositable fine powder onto the right side 2B of said photosensitive plate by the heating roll 4B having a high releasing surface, while preventing the photosensitive plate from unfavourable results from heat expansion of said plate due to rapid heating of the right side 2B of said plate with the heating roll 4B. The desired heating characteristics of the heater 7 is the same as the pre-heat roll 4A mentioned in the preceding embodiment.

The other embodiment is one having a preheating roll 4A as shown in FIG. 1 added to the embodiment as shown in FIG. 2.

Figure 3:
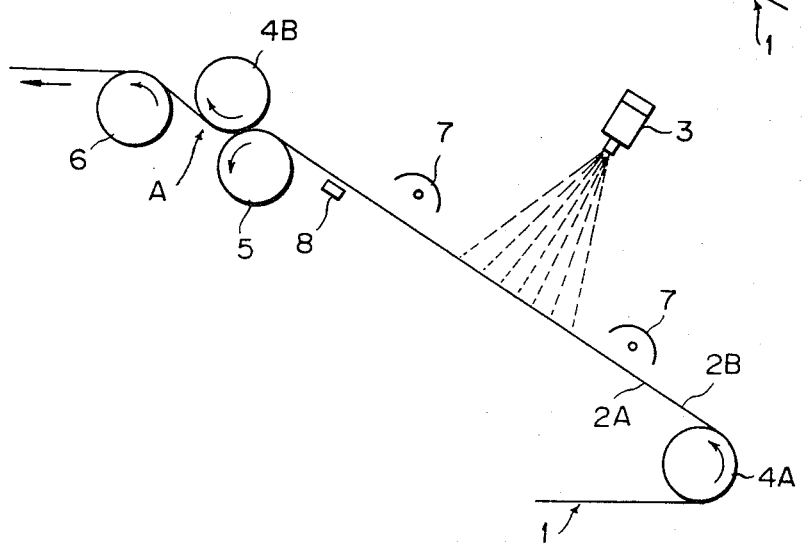
FIG. 3 is a schematic diagram outlining the practice of the present process in other different embodiment thereof.

Referring then to FIG. 3, there is illustrated other preferred embodiment of the present process. In this embodiment, a temperature detector 8 is applied to the embodiment shown in FIG. 1 or FIG. 2. The temperature of the photosensitive plate immediately before contact with the heating roll 4B is detected by means of a heat detector 8 and, while heating ability of the heating roll 4A and/or 4B, the far infrared heater 7 or both is automatically controlled so as to maintain the said temperature constant, said photosensitive plate is passed through between the heating roll 4B and the press contacting roll 5. Thus, the heat-depositable fine powder uniformly dispersed and adhered to the right side 2B of said plate 1 is fused and deposited onto the right side 2B preferably.

The heating roll 4A, 4B or the heater 7 may be under the same conditions as mentioned in the preceding embodiments.

While in FIG. 3 the heat detector is placed just before the heating roll 4B, its position is not limited to this embodiment but may be near to the roll 4B, such as just after the roll 6 or position indicated by A.

The heat-depositable fine powder which may be employed in this invention may be any of those that will fuse and become fixed by heating onto the surface of the right side of a photosensitive plate after having been dispersed thereon. The heat-depositable fine powder comprises preferably a solid powder substantially composed of a substance or composition that has a lower first transition point or second transition point than the first transition point of a photosensitive layer or a solid powder having a surface layer substantially composed of the said substance or composition, and it is more preferable that the first and second transition points of the said substance or composition be 40° C. or higher and the first or second transition point of the said substance or composition is lower than the first transition point of the photosensitive layer. Further, there may be employed in this invention any heat-depositable fine powder having a higher first transition point than that of the photosensitive layer, since only the heat-depositable fine powder dispersed onto the surface of a photosensitive plate is rapidly heated and fused without heating the whole photosensitive plate to an elevated temperature.

In the present invention, the term "first order transition point" means a Vicat softening point, which can be tested according to ASTM designation D.1525-70, and the term "second order transition point" means a generally known glass transition point, which can be tested according to, for example, the description on pages 43 to 45 of "Textbook of Polymer Chemistry" by Fred W. Billmeyer, Jr. (Interscience Publishers, Inc., New York, 1957).

Preferable examples may include polyvinyl acetate, polyvinylidene chloride, polyethylene oxide, polyethylene glycol, polyacrylic acid, polymethacrylic acid, polyacrylamide, polymethacrylamide, polyacrylate such as polybutyl acrylate, polymethacrylate, polystyrene and derivatives thereof, and copolymers of monomers of these polymers, polyvinyl methyl ether, epoxy resins, phenol resins, polyamides, polyvinyl butyral, etc.

The heat-depositable fine powder which may be employed in this invention is preferably one that is soluble in a developer; Two types of developer are usually used. One is an aqueous strong alkali solution, e.g., silicates and the other is an organic solvent such as alcohols, glycols, ketones. Additionally, there may be employed any matt agents well-known to be commonly used for coarsening a surface of a material, (for example, fine solid powder of silica, zinc oxide, titanium oxide, zirconium oxide, alumina, polymethyl methacrylate, polystyrene, phenol resins and the like), the surface of which is covered with the above-mentioned heat-depositable fine powdery material.

The heat-depositable fine powder which is supplied over the surface of a photosensitive plate should have a constant directional size of $0.5$–$40\mu$, more preferably $1$–$17\mu$. Namely, if the heat-depositable fine powder has a constant directional size of less than $0.5\mu$, an improved vacuum contacting property is hardly observed, while, if the size is more than $40\mu$, reproducibility of smaller dots is diminished.

In order to make uniform the grain size of the fine powder within the above-defined range, there may be applied any well-known classification techniques. Also, there is no particular restriction upon the shape of a heat-depositable fine powder to be employed, provided that the above-defined directional size range is maintained. For example, one may utilize a spherical shaped powder, an amorphous powder formed by grinding with a ball mill, a jet mill or the like.

An amount of the heat-depositable fine powder to be supplied over the surface of a photosensitive plate for printing in this invention should be such that $0.005$–$0.5$ g./m$^2$ of the powder be uniformly spread and deposited over the surface of a photosensitive plate for printing. After all, if less than $0.005$ g./m$^2$ of the powder is deposited, a vacuum contacting property can not satisfactorily be improved, while if more than $0.5$ g./m$^2$ applied, reproducibility of smaller dots is diminished. According to the present process, the heat-depositable fine powder uniformly dispersed and adhered onto the plate surface at the above-defined ratio can be heat-deposited onto the surface of the plate by contacting with the heating rolls in an amount substantially equal amount to the amount which was dispersed onto the plate. For uniform dispersing and adherence of the heat-depositable fine powder onto the plate surface at the above-mentioned ratio in the present process, there may be favourably applied a dust supplier as well as other known techniques such as fluidized bed electrostatic sprayers, electrostatic fluidized beds as disclosed in "Plastic Eng. Handbook" (1967) by J. J. Sokol and R. C. Hendrickson, air sprayers, blushes, puffs and the like.

The heating rolls having a high releasing surface which may be employed in the present process are to act as heat-depositing the heat-depositable fine powder uniformly dispersed and adhered onto the plate surface at the said ratio, by contacting therewith and may be any of those wherein the said powder does hardly adhere to the surface of the said roll. As examples thereof, one may employ known heating rolls lined with a fluororesin, e.g., "Teflon" (tradename) over the surface thereof, heating rolls having a coarse surface impregnated with a fluororesin, heating rolls covered with a tube made of a thermoshrinking fluororesin such as a tetrafluoroethylene-hexafluoropropylene copolymer, heating rolls made of a siicone resin and the like. It is convenient that the thickness of such high releasing resin layer as the said fluororesin, silicone resin layers is not less than $100\mu$ to facilitate control of heat transfer when the said fine power heat-deposited. Also, it is not preferable that the layer be too thick in view of possible thermal efficiency, while it is preferred that the heating rolls having a high releasing surface have a smooth surface.

As explained hereinabove, the present process can be accomplished by heat-depositing onto the plate surface a heat-depositable fine powder uniformly dispersed and adhered over the said plate surface through contacting the said plate surface with such heating rolls having a high releasing surface. The heat-deposit in the present invention is meant to have the deposited fine powder fixed at such a strength that the said powder can not easily fall off by various contacts encountered during conventional process steps. It is particularly preferred that the powder is fixed such that an unfavourable foreign material when adhered onto the surface of a photosensitive plate may be removed, while the deposited powder may remain deposited, by sweeping with clothes or like means. Consequently, the heating temperature with heating rolls may be satisfactorily within the range requisite and sufficient to fuse the fine powder and fix it onto the plate surface at the above-defined ratio and then appropriate temperature may be selected depending upon the preheating temperature of the plate by the said preheating rolls 4A, the sort, melting point and amount of the fine powder to be heat-deposited, the type of photosensitive plate for printing and the like.

The heating temperature of heating rolls employed in this invention may be properly selected as depicted above, but preferably it should be selected so that the surface temperature of the plate be within the following temperature range immediately after leaving the said heating rolls: Namely, it ranges from the second transition point of the fine powder applied through a temperature obtained by adding $100°$ C. to the first transition point of the fine powder.

As photosensitive materials to be coated on supports, there may be used any materials so long as they change their solubility or swelling property relative to developers by means of exposure. Particularly preferable as the photosensitive materials are photosensitive compositions comprising diazo compounds, e.g. diazo resins, and/shellac (Japanese Laid-Open-to-Public Publn. No. 24404/1972), those comprising poly(hydroxyethylmethacrylate) and diazo resins, and diazo resins and soluble polyamide resins (U.S. Pat. No. 3,751,257), those comprising photosensitive products of azide and epoxy resins (U.S. Pat. No. 2,852,379), and photosensitive compositions which are useful as negative working type photosensitive compositions capable of becoming insoluble by the action of actinic ray, said compositions comprising photosensitive resins having in such a molecule, e.g., polyvinyl cinnamate, at least two unsaturated double bonds and which dimerize when irradiated by actinic rays to become insoluble, such as photosensitive products of azide, diazo resins, etc., for instance, derivatives of polyvinyl cinnamate as disclosed in the specifications of British Pat. Nos. 843,543 and 966,297 and U.S. Pat. No. 2,725,372, prepolymers of diallyl phthalate as disclosed in U.S. Pat. No. 3,462,267 and such ethylenically unsaturated compounds as having in the molecule at least two unsaturated double bonds and bringing about polymerization reaction on irradiation of actinic ray as disclosed in Japanese Patent Publication No. 8495/1960, and a suitable binder, for example, polyvinyl alcohol or such compounds being derivatives of cellulose and having on the side chain carboxy groups, e.g. polyvinyl-H-phthalate and carboxymethylcellulose, or copolymers of methyl methacrylate and methacrylic acid. The aforesaid ethylenically unsaturated compounds disclosed in Japanese Patent Publn. No. 8495/1960 include unsaturated esters of polyol, e.g. ethylenediacrylate, diethyleneglycoldiacrylate, glyceloldiacrylate, glycelotriacrylate, ethylenedimethacrylate, 1,3-propylenediacrylate, 1,4-cyclohexanediolacrylate, 1,4-benzenedioldiacrylate, pentaerythritoltetraacrylate, 1,3-propyleneglycoldiacrylate, pento-1,5-dioldimethacrylate, pentaerythritoltriacrylate, bisacrylate and methacrylate of polyethylene glycol having molecular weight of 50 to 500, unsaturated amides, particularly amide of α-methylenecarboxylic acid and α,ω-diamine and ω-diamine having intermediary oxygen, e.g. methylenebisacrylamide and diethylenetriaminetrisacrylamide, divinyl succinate, divinyl adipate, divinyl phthalate, divinyl terephthalate, divinylbenzene-1,3-disulfonate, or such a corresponding compound that contains methacrylate or methacrylamide instead of acrylate or acrylamide in the above-mentioned compounds respectively, etc. Useful as positive working type photosensitive compositions are those which comprise such matters as disclosed in U.S. Pat. Nos. 3,635,709, 3,061,430 and 3,061,120, photosensitive products of o-diazo oxide type, phosphotungstates of diazo resins (Japanese Patent Publn. No. 7663/1964), and potassium ferrocyanide of diazo resins (U.S. Pat. No. 3,113,023). Furthermore, such photosensitive compositions containing linear polyamides and monomers having addition polymerizable unsaturations as disclosed in the specifications of U.S. Pat. Nos. 3,081,168, 3,486,903, 3,512,971 and 3,615,629 are also useful.

As the support of the photosensitive plate of the present invention, there may be, for example, employed preferably an aluminum plate, a composite sheet having an aluminum sheet bonded on a polyethyleneterephthalate film as disclosed in Japanese Patent Publication No. 18327/1973 and the like when a lithographic printing plate is applied, while an aluminum plate, an iron plate and the like when a typographic printing plate is applied. Said support may include those layers which have been surface-treated by well-known methods and may have any subbing layer. Further, the photosensitive layer provided on a support may be any of such well-known layers wherein a photosensitive material may show changes in solubility or wettability to a developer before and after exposure.

Accordingly, the present invention facilitates control of the heating temperature requisite for the above heat-deposit precisely, and heating the said plate gradually and slowly, as compared with the case of a heating rolls only. Further, where preheating of a photosensitive plate is effected by the use of solely a far infrared heater, one may have additional advantage that there is not observed incomplete fusion in the middle of the plate caused by differences in temperature distributions at width direction, nor adverse effect on both ends in width owing to over-heating, as sometimes seen in the case of a preheating roll.

The above explanation about preheating of a photosensitive plate for printing is referred to a preheating roll and a far infrared heater, but it should be understood that a preheating means is not limited to them. There may be favourably employed any heat source if it is capable of heating a photosensitive plate for printing in a non-contacting manner and does not adversely affect photosensitive properties of said plate.

The process of this invention will be more fully illustrated by way of the following examples.

EXAMPLE 1

A styrene-acrylic acid-butyl acrylate (45:30:25) copolymer was pulverized and then classified by the use of a zigzag classification apparatus manufactured by Alpime Co., Ltd. to prepare heat-depositable fine powder having a constant directional size of 0.5-40μ.

A photosensitive plate for printing (Sakura PS plate SLP, a thickness of 0.3 mm) was continuously run at a constant speed of 10 m./min., while it was preheated to 80° C. at the right side of the said plate by contacting a heated preheat roll with the plate at the reverse side thereof. Then, the fine powder was uniformly spread and adhered onto the right side of the said plate at a ratio of 0.05 g./m² of the plate surface by means of a dust supplier adapted to provide a constant amount of the said fine powder. Thereafter, the plate was passed through between a heating roll 4B and a press welding roll 5 and then carried by a roll 6, as shown in FIG. 1. More specifically, the heating roll was covered with a heat-shrunk tube of a tetrafluoroethylenehexafluoropropylene copolymer and the surface temperature of the said roll was maintained at 110° C., while the contact pressure between the said roll 4B and the said insulating, elastic roll 5 was adjusted to 1.2 kg. per 1 cm. width of the said plate. After passing between both rolls, the said plate was contacted with the heating roll 4B so as to be a contact length of 70 mm (as shown with signal A in FIG. 1), whereby the said fine powder was heat-deposited onto the surface of the said plate to prepare the sample according to this invention.

The resultant photosensitive plate for printing (the above sample) required only 1 minute and 30 seconds for vacuum contact upon contact printing, whereas a photosensitive plate before the treatment of this invention took 2 minutes and 20 seconds.

For contact printing herein, a photographic film (500×700 mm) having 20% dotted image and formed with Sakura OL-100E film was subjected to vacuum contact with the sample (800×1003 mm) by the use of a horizontal vacuum printing frame, KD-P1 type printing frame, available from Kamodenki Kenkyusho, Japan.

The above present photosensitive plate sample and a photosensitive plate not treated according to this invention were exposed for 3 min. to a 2 KW metal halide lamp at a distance of 11/4 m. and then developed by dipping in a 1% aqueous solution of sodium tertiary silicate for 45 seconds. The heat-deposited fine powder gave a positive image just as an original negative did without any influence upon development. Printing performance upon printing was completely equivalent in both printing plates. Namely, no influence was observed on development and printing performance (in both imaged line and non-imaged line portions) owing to deposit of the heat-depositable fine powder on the surface of the said plate.

The same procedures as in this example was repeated except that a heat-depositable fine powder to be uniformly spread and adhered onto the plate surface was used at a ratio of 0.6 g. and 0.004 g. per m². In the case of the 0.6 g./m² ratio, reproducibility of smaller dots was diminished and insufficient improvement in vacuum contacting property was observed when the 0.004 g./m² ratio was applied.

Then, the same procedures as in this example was repeated except that a heat-depositable fine powder to be uniformly spread and adhered onto the plate surface has a constant directional size of more than 40μ or of less than 0.5 μ. In the case of the more than 40μ size, reproducibility of smaller dots was diminished and insufficient improvement in vacuum contacting property was observed when the less than 0.5μ size was used.

EXAMPLE 2

A styrene-acrylic acid-butyl acrylate (45:30:25) copolymer was pulverized and then classified by the use of a zigzag classification apparatus manufactured by Alpime Co., Ltd. to prepare heat-depositable fine powder having a constant directional size of 0.5–40μ.

A photosensitive plate for printing (Sakura PS plate SLP, a thickness of 0.3 mm) was continuously run at a constant speed of 10 m./min. and, while the said fine powder was uniformly spread and adhered onto the right side of the said plate at a ratio of 0.05 g./m² of the plate surface by means of a dust supplier adapted to provide a constant amount of the said fine powder, the said plate was heated to 80° C. at the plate surface by a far infrared heater from the right side of the above plate. Thereafter, the plate was passed through between the heating roll 4B and the press contacting roll 5 and then carried on the roll 6 as shown in FIG. 2. More specifically, the heating roll, which was previously covered with a heat-shrunk tube of a tetrafluoroethylene-hexafluoropropylene copolymer, was employed and the surface temperature of the said roll was maintained at 110° C., while a contact pressure between the said roll 4B and the said insulating, elastic roll 5 was adjusted to 1.2 kg. per 1 cm. width of the said plate. After passing between both rolls, the said plate was contacted with the heating roll 4B so as to be a contact length of 70 mm (as shown with signal A in FIG. 2), whereby the said fine powder was heat-deposited onto the surface of the said plate to prepare the sample according to this invention.

The resultant photosensitive plate for printing (the above sample) required only 1 minute and 30 seconds for vacuum contact upon contact printing, whereas a photosensitive plate before the treatment of this invention took 2 minutes and 20 seconds.

For contact printing herein, a photographic film (500×700 mm) having 20% dotted image and formed with Sakura OL-100E film was subjected to vacuum contact with the sample (800×1003 mm) by the use of a horizontal vacuum printing frame, KD-P1 type printing frame, available from Kamodenki Kenkyusho, Japan.

The above present photosensitive plate sample and a photosensitive plate not treated according to this invention were exposed for 3 to a 2 KW metal halide lamp at a distance of 1 1/4 m. and then developed by dipping in a 1% aqueous solution of sodium tertiary silicate for 45 seconds. The heat-deposited fine powder gave a positive image just as an original negative did without any influence upon development. Printing performance upon printing was completely equivalent in both printing plates. Namely, no influence was observed on development and printing performance (in both imaged line and non-imaged line portions) owing to deposit of the heat-depositable fine powder on the surface of the said plate.

The same procedures as in this example was repeated except that a heat-depositable fine powder to be uniformly spread and adhered onto the plate surface was used at a ratio of 0.6 g. and 0.004 g. per m². In the case of the 0.6 g./m² ratio, reproducibility of smaller dots was diminished and insufficient improvement in vacuum contacting property was observed when the 0.004 g./m² ratio was applied.

Then, the same procedures as in this example was repeated except that a heat-depositable fine powder to be uniformly spread and adhered onto the plate surface has a constant directional size of more than 40μ or of less than 0.5μ. In the case of the more than 40μ size, reproducibility of smaller dots was diminished and insufficient improvement in vacuum contacting property was observed when the less than 0.5μ size was used.

EXAMPLE 3

A styrene-acrylic acid-butyl acrylate (45:30:25) copolymer was pulverized and then classified by the use of a zigzag classification apparatus manufactured by Alpime Co., Ltd. to prepare heat-depositable fine powder having a constant directional size of 0.5–40μ.

A photosensitive plate for printing (Sakura PS plate SLP, a thickness of 0.3 mm) was continuously run at a constant speed of 10 m./min. The said plate was contacted with the preheating roll heated from the reverse side of said plate and then heated by the far infrared heater from the right side of said plate: While a surface temperature of said plate was detected by a heat detector 8 so that the temperature was 80° C. immediately before contact with the heating roll 4B, the fine powder was uniformly spread and adhered onto the right side of the said plate at a ratio of 0.05 g./m² of the plate surface by means of a dust supplier adapted to provide a constant amount of the said fine powder between the two far infrared heaters 7, 7 while a heating ability of the preheating roll 4A and the far infrared heater 7 was controlled. Thereafter, the plate was passed between the heating roll 4B and the press contacting roll 5 and then carried on the roll 6 as shown in FIG. 3. More specifically, the heating roll was covered with a heat-shrunk tube of a tetrafluoroethylenehexafluoropropylene copolymer and the surface temperature of the said roll was maintained at 110° C., while a contact pressure between the said roll 4B and the said insulating, elastic roll 5 was adjusted to 1.2 kg. per 1 cm. width of the said plate. After passing between both rolls, the said plate was contacted with the heating roll 4B so as to be a contact length of 70 mm (as shown with signal A in FIG. 1), whereby the said fine powder was heat-deposited onto the surface of the said plate to prepare the sample according to this invention.

The resultant photosensitive plate for printing (the above sample) required only 1 minute and 25 seconds for vaccum contact upon contact printing, whereas a photosensitive plate before the treatment of this invention took 2 minutes and 20 seconds.

For contact printing herein, a photographic film (500×700 mm) having 20% dotted image and formed with Sakura OL-100E film was subjected to vacuum contact with the sample (800×1003 mm) by the use of a horizontal vacuum printing frame, KD-P1 type printing frame, available from Kamodenki Kenkyusho, Japan.

The above present photosensitive plate sample and a photosensitive plate not treated according to this invention were exposed for 3 min. to a 2 KW metal halide lamp at a distance of 11/4 m. and then developed by dipping in a 1% aqueous solution of sodium tertiary silicate for 45 seconds. The heat-deposited fine powder gave a positive image just as an original negative did without any influence upon development. Printing performance upon printing was completely equivalent in both printing plates. Namely, no influence was observed on development and printing performance (in both imaged line and non-imaged line portions) owing to deposit of the heat-depositable fine powder on the surface of the said plate.

The same procedures as in this example was repeated except that a heat-depositable fine powder to be uniformly spread and adhered onto the plate surface was used at a ratio of 0.6 g. and 0.004 g. per m$^2$. In the case of the 0.6 g./m$^2$ ratio, reproducibility of smaller dots was diminished and insufficient improvement in vacuum contacting property was observed when the 0.004 g./m$^2$ ratio was applied.

Then, the same procedures as in this example was repeated except that a heat-depositable fine powder to be uniformly spread and adhered onto the plate surface has a constant directional size of more than 40μ or of less than 0.5μ. In the case of the more than 40μ size, reproducibility of smaller dots was diminished and insufficient improvement in vacuum contacting property was observed when the less than 0.5μ size was used.

What is claimed is:

1. A process for the production of a photosensitive plate for printing which comprises a photosensitive layer side and a support side having a fine powder fixed to the surface of said photosensitive layer side, which comprises
    uniformly dispersing and adhering a heat-depositable fine powder having a constant directional size of 0.5–40μ onto said surface of a photosensitive plate in an amount of 0.005–0.5 g. of the said powder per square meter of the said plate;
    preheating said photosensitive plate; and
    contacting said surface of said preheated plate to which said powder is adhered with a heating roll to fuse and fix said fine powder to said surface of said plate.

2. The process of claim 1 wherein said plate is preheated before said fine powder is dispersed thereon.

3. The process of claim 1 wherein said plate is preheated after said fine powder is dispersed thereon.

4. The process of claim 1 wherein said plate is preheated while said fine powder is dispersed thereon.

5. The process of claim 1 or 2 wherein said preheating is effected by contacting said support side of said photosensitive plate with a preheating roll.

6. The process of claim 1 or 2 wherein said preheating is effected by directing a non-contacting heating means against a surface of said photosensitive plate.

7. The process of claim 3 wherein said preheating is effected by directing a non-contacting heating means against a surface of said photosensitive plate.

8. The process of claim 5 wherein said non-contacting heating means are infrared rays or far infrared rays.

9. The process of claim 1, wherein said preheating comprises detecting the temperature of said preheated photosensitive plate and maintaining the temperature of said preheated photosensitive plate substantially constant immediately before contact of said photosensitive plate with said heating roll.

10. The process of claim 9, wherein said maintaining step comprises controlling the preheating of said photosensitive plate by means of a controller.

11. The process of claim 9, wherein said plate is preheated before said fine powder is dispersed thereon.

12. The process of claim 9 wherein said plate is preheated after said fine powder is dispersed thereon.

13. The process of claim 9 wherein said plate is preheated while said fine powder is dispersed thereon.

14. The process of claim 9 wherein said preheating is effected by contacting said support side of said photosensitive plate with a preheating roll.

15. The process of claim 9 wherein said preheating is effected by directing a non-contacting heating means against a surface of said photosensitive plate.

* * * * *